United States Patent
Konstad et al.

[11] Patent Number: 6,130,820
[45] Date of Patent: Oct. 10, 2000

[54] MEMORY CARD COOLING DEVICE

[75] Inventors: Rolf A. Konstad, Gold River; Brad A. Smelser, Rancho Cordova, both of Calif.

[73] Assignee: Intel Corporation, Santa Clara, Calif.

[21] Appl. No.: 09/305,153

[22] Filed: May 4, 1999

[51] Int. Cl.[7] ........................................ H05K 7/20

[52] U.S. Cl. .................... 361/695; 361/690; 361/694; 361/719; 361/720; 174/16.1; 165/80.3; 165/104.33; 165/104.34

[58] Field of Search ..................... 361/695, 697, 361/702, 704, 707, 709, 710, 720, 721; 257/718, 719, 722; 174/16.1, 16.3; 165/80.3, 185

[56] References Cited

U.S. PATENT DOCUMENTS

| | | | |
|---|---|---|---|
| 5,218,514 | 6/1993 | Huynh et al. | 165/80.3 |
| 5,353,863 | 10/1994 | Yu | 165/80.3 |
| 5,630,469 | 5/1997 | Butterbaugh et al. | 165/80.3 |
| 5,852,547 | 12/1998 | Kitlas et al. | 361/695 |
| 5,926,367 | 7/1999 | Gutierrez et al. | 361/695 |
| 5,936,836 | 8/1999 | Scholder | 361/695 |
| 5,943,209 | 8/1999 | Liu | 361/695 |

*Primary Examiner*—Leo P. Picard
*Assistant Examiner*—Boris L. Chervinsky
*Attorney, Agent, or Firm*—Mark V. Seeley

[57] ABSTRACT

An improved assembly for a computer that includes a memory card inserted into a socket mounted to a computer motherboard. A fan is positioned adjacent to the memory card and a support structure couples the fan to the motherboard.

7 Claims, 2 Drawing Sheets

MEMORY CARD COOLING DEVICE

FIELD OF THE INVENTION

The present invention relates to an apparatus for cooling components within a computer system enclosure. More specifically, the invention relates to an apparatus for dissipating heat generated by memory components mounted on the surface of a memory card.

BACKGROUND OF THE INVENTION

The memory devices included in DIMMs and SIMMs currently used in personal computers do not generate so much heat that they require a heat dissipation device to cool them. New memory devices, however, such as Rambus DRAMs ("RDRAMs") and higher frequency SDRAMs may produce significantly more heat, which may require some type of heat dissipation device to cool RDRAM containing DIMMs or SIMMs.

A dual sided heat sink that encloses the memory module may provide that function, as described in U.S. Ser. No. 08/992,617, filed Dec. 17, 1997, and assigned to this application's assignee. Another possibility is to blow air onto the DIMMs or SIMMs, as it is blown onto the motherboard, e.g., through a duct targeted at a section of the motherboard where heat generating components are mounted. An example of a system that uses such a heat dissipating design is described in U.S. Ser. No. 09/015,423, filed Jan. 29, 1998, and assigned to this application's assignee.

The heat sink solution may be relatively expensive. In addition, the mass added to the memory module could cause the device to be more susceptible to damage, when the system is shocked or vibrated. The fan duct alternative may apply to specific form factors only and may only permit a limited number of chassis and motherboard layout configurations.

Accordingly, there is a need for an improved memory module cooling device. There is a need for such a device that is relatively inexpensive and light weight, which can withstand shocks and vibrations. In addition, there is a need for such a device that may be used with various form factors, layouts and chassis designs.

SUMMARY OF THE INVENTION

An improved assembly for a computer is disclosed. That assembly includes a memory card inserted into a socket mounted to a computer motherboard. A fan is positioned adjacent to the memory card and a support structure couples the fan to the motherboard. In one embodiment, the support structure comprises a molded duct structure which straddles the memory card. In another embodiment, the support structure comprises a bracket for mounting the fan on top of the memory card.

DETAILED DESCRIPTION OF THE PRESENT INVENTION

An apparatus for cooling a memory card is described, as is an assembly for a computer that uses that apparatus. In the following description, numerous specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
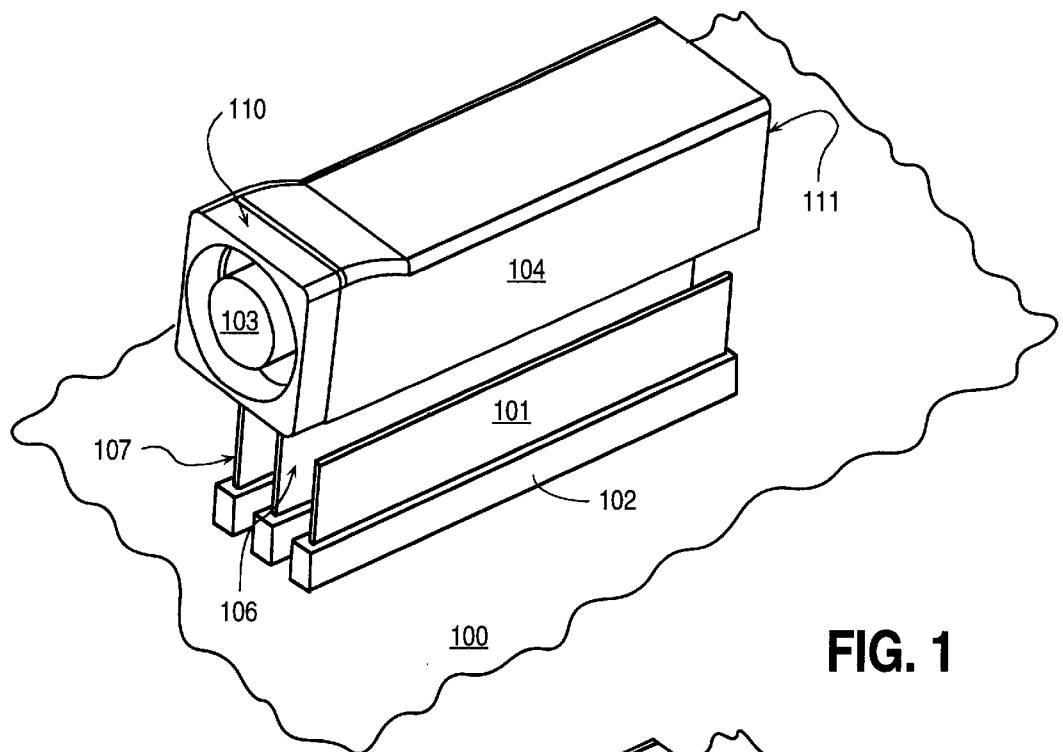
FIG. 1 is a perspective view of an embodiment of the assembly for a computer of the present invention, which shows a molded duct and fan as that cooling structure is being placed over a plurality of memory cards.

As shown in FIG. 1, the assembly for a computer of the present invention comprises memory card 101 inserted into a socket 102 mounted to a computer motherboard 100. Also shown are fan 103 and support structure 104, which couples fan 103 to motherboard 100. In this embodiment, support structure 104 comprises a molded duct structure.

Figure 2:
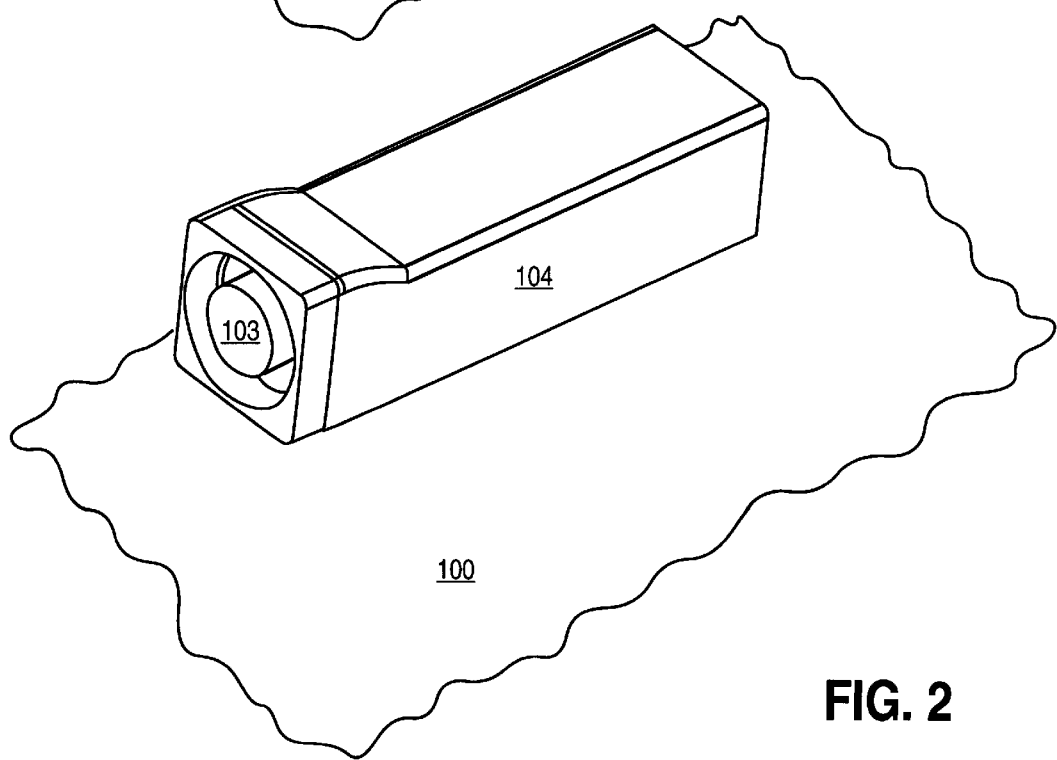
FIG. 2 is a perspective view of the embodiment shown in FIG. 1, which shows the molded duct and fan combination after it is placed over a plurality of memory cards.

In FIG. 1, fan 103 and duct 104 are shown as they are being lowered into position over memory cards 101, 106 and 107. As shown in FIG. 2, duct 104 positions fan 103 adjacent to memory card 101 and memory cards 106 and 107, while straddling those memory cards. In this embodiment, fan 103 is positioned in a plane that is substantially perpendicular to motherboard 100. Because, in FIG. 2, duct 104 covers memory cards 101, 106, 107, those memory cards are not visible.

Duct 104 preferably is made of plastic or another light weight material, and has an open first end 110 and an open second end 111. Duct 104 may be snapped or fastened into holes in motherboard 100 (not shown) that may be located adjacent to the memory cards. Any type of fastening device may be used to fasten duct 104 to motherboard 100, including screws, bolts, pegs, expandable prongs, ball and socket, welds, etc. . . . Fasteners may be integrally molded into duct 104. Fan 103, as shown, is placed at first end 110 of duct 104. Fan 103 forces air through open first end 110 of duct 104 until it exits through open second end 111 of duct 104.

The fan and duct assembly shown in FIG. 1 may consist of separate components or be one integrated unit. Although shown to feed air into one end of duct 104 and out the other end, fan 103 could instead be placed on top of duct 104 for feeding air down onto the memory cards. Fan 103 may cool the memory cards by forcing air into duct 104 or by pulling air from duct 104. Instead of having an exit region at the end of duct 104 positioned opposite to fan 103, exit regions could be placed at the sides of duct 104 or on top of duct 104. For example, duct 104 could be configured so that it has openings around its periphery through which air may exit from, or be drawn into, duct 104. Power may be provided to fan 103 by running a wire from a power supply located elsewhere on the motherboard or chassis to fan 103. Alternatively, fan 103 may contain its own dedicated battery.

Duct 104 may be coupled to motherboard 100 in many different ways. For example, instead of being snapped or fastened onto motherboard 100, duct 104 may fasten to sockets 102, which are mounted to the motherboard, or to another component fixed to motherboard 100—such as the memory cards themselves. In addition, duct 104 could be coupled to motherboard 100 by fixing duct 104 to the chassis. Duct 104 preferably is slightly longer than the sockets that receive the memory cards, preferably no more than one inch longer than those sockets. Duct 104 preferably is slightly wider than the area where the sockets are mounted, preferably no more than one inch wider than that area. Duct 104 can optionally be made from, or include, material that provides EMI shielding.

Figure 3:
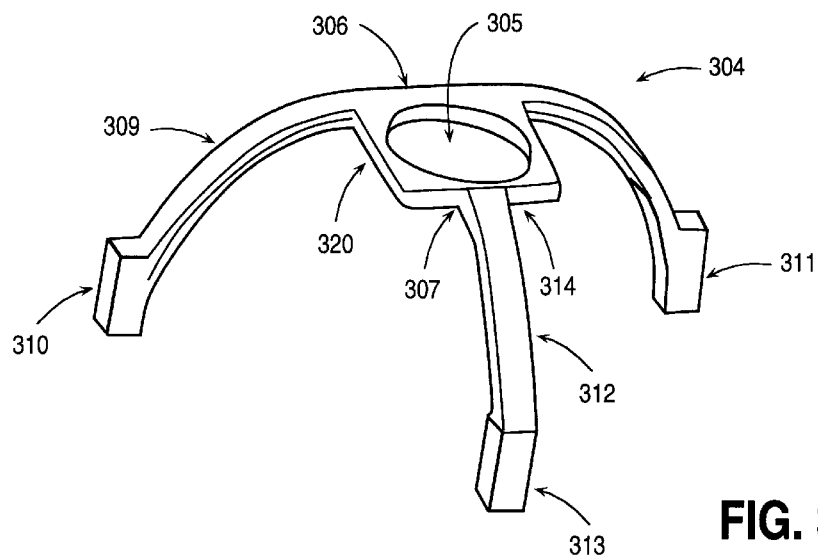
FIG. 3 is a perspective view of an embodiment of a bracket that may be used in a second embodiment of the assembly for a computer of the present invention.

FIG. 3 shows bracket 304 that may be used to make another embodiment of the cooling device of the present invention. Bracket 304 includes receptacle 305, which is defined by mounting block 320, for receiving a fan. Mounting block 320 has first edge 306 and second edge 307 opposite first edge 306. Bracket 304 also includes first bowed supporting member 309, which has first end 310 and second end 311. Bowed supporting member 309 may be coupled at each end 310 and 311 to a motherboard on a first side of a memory card, and is coupled to mounting block 320 at first edge 306.

In this embodiment, where bracket 304 is one integrated piece, there is no delineation between supporting member 309 and edge 306. Here, the term "edge" is used simply to describe a boundary for receptacle 305 and is not intended to reflect an endpoint for any particular structure. The term "bowed," as used herein, does not necessarily mean substantially circular. Instead, that term is simply meant to indicate that the support member is shaped for attachment to a motherboard at each end, while rising above the motherboard sufficiently to support a fan positioned above a memory card. The "bow" in such a support member may be any shape, e.g., substantially circular, substantially rectangular, substantially triangular, etc. . . .

Bracket 304 also includes second bowed supporting member 312, which has first end 313 and second end 314. Second bowed supporting member 312 is located at a substantially perpendicular orientation to first bowed supporting member 309, and may be coupled at first end 313 to a motherboard on a second side of a memory card. Bowed supporting member 312 is coupled to second edge 307 of mounting block 320 at second end 314. Although bracket 304, as shown, includes a substantially circular receptacle for receiving a fan, receptacle 305 may be of any shape.

Figure 4:
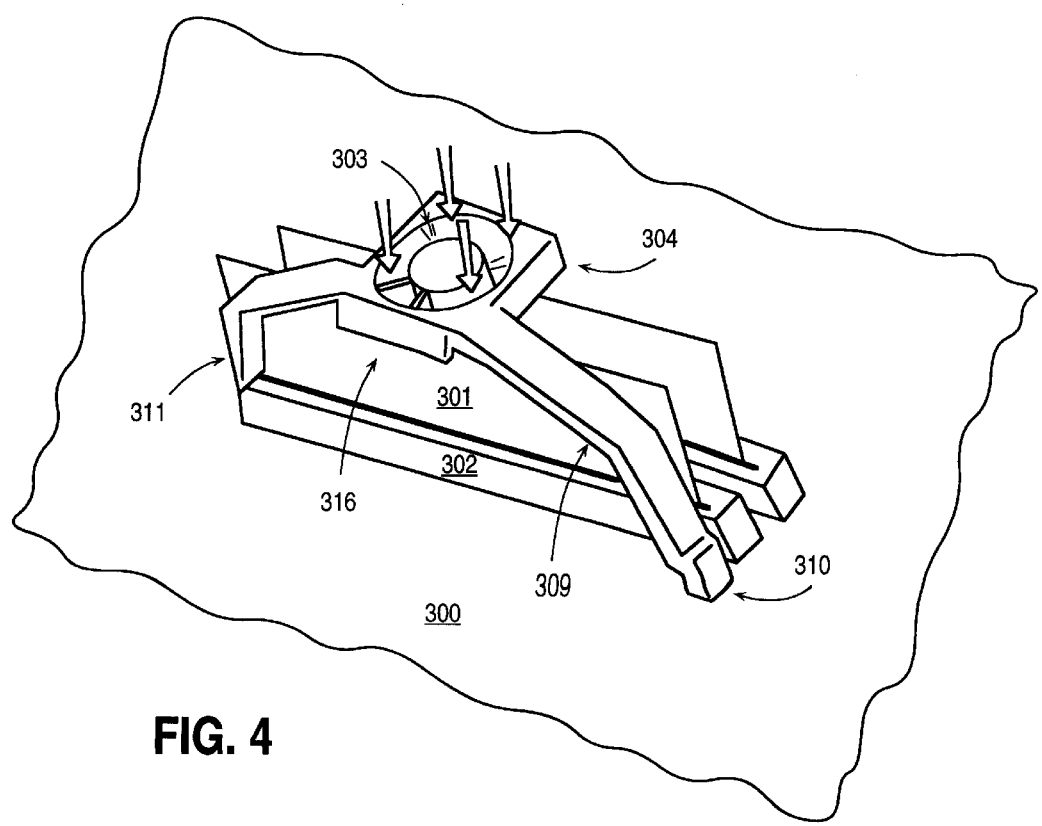
FIG. 4 is a perspective view showing use of the bracket of FIG. 3 to position a fan over a plurality of memory cards.

FIG. 4 shows how the bracket shown in FIG. 3 may be mounted to motherboard 300 for straddling memory card 301 that may be inserted into socket 302. Bracket 304 mounts fan 303 on top of memory card 301. As shown, bowed supporting member 309 is coupled at each end 310 and 311 to motherboard 300 on first side 316 of memory card 301. Although not visible from this angle, second bowed connecting member 312 is coupled at first end 313 to motherboard 300 on the other side of memory card 301.

Although bracket 304 is shown as having both first bowed supporting member 309 and second bowed supporting member 312, bracket 304 could alternatively consist of first bowed supporting member 309 without also having bowed supporting member 312. When used, such a bracket suspends fan 303 over memory card 301 without the additional support that member 312 would otherwise have provided.

A relatively small fan should be sufficient to provide adequate cooling for the memory cards. Consequently, receptacle 305 preferably has a diameter between about 30 mm and about 50 mm, and most preferably about 40 mm. First end 310 and second end 311 of first bowed supporting member 309 each may terminate with a collar, preferably having an outer diameter that is less than about 0.6 inches. Each collar preferably defines an orifice that is less than about 0.2 inches, through which a fastener may be inserted to connect bracket 304 to motherboard 300. When fastened to an ATX motherboard, fasteners may be inserted through the collars and into mounting holes located on the motherboard. Alternatively, as described above in connection with FIGS. 1 and 2, ends 310 and 311 may terminate as an expandable prong, or other structure, that may snap into motherboard openings to couple bracket 304 to motherboard 300.

An improved apparatus for cooling a memory card has been described. This apparatus decouples the memory card cooling hardware from the chassis. This may allow the memory card to be cooled in any form factor chassis with minimal design limitations. This apparatus also reduces motherboard layout limitations, when compared to those of other proposed cooling solutions, by requiring only a minimal interface definition in the immediate vicinity of the memory cards. When a heat sink is not used, shock and vibration concerns may also be substantially alleviated.

Features shown in the above referenced drawings are not intended to be drawn to scale, nor are they intended to be shown in precise positional relationship. Additional components that may be mounted on the motherboard have been omitted as they are not useful to describe aspects of the present invention.

Although the foregoing description has specified an apparatus for cooling a memory card that includes certain features, those skilled in the art will appreciate that many modifications and substitutions may be made. For example, although the embodiments described above do not show a memory card that includes a heat sink, the above described memory card cooling apparatus may be combined with such a memory card to provide an even more robust cooling solution. Accordingly, it is intended that all such modifications, alterations, substitutions and additions be considered to fall within the spirit and scope of the invention as defined by the appended claims.

What is claimed is:

1. A motherboard assembly comprising:
   a memory card inserted into a socket mounted to a computer motherboard; and
   a bracket coupled to the motherboard that suspends a fan above the memory card, the bracket including a receptacle for receiving the fan.

2. The assembly of claim 1 wherein the bracket is mounted to the motherboard and straddles the memory card.

3. The assembly of claim 1 wherein
   the receptacle is defined by a mounting block having a first edge; and wherein the bracket comprises
   a bowed supporting member having a first end and a second end, the bowed supporting member being coupled at each end to the motherboard on a first side of the memory card, and being coupled to the mounting block at the first edge.

4. The assembly of claim 2 wherein the bracket comprises:
   a receptacle for receiving the fan, the receptacle defined by a mounting block having a first edge and a second edge opposite the first edge;
   a first bowed supporting member having a first end and a second end, the first bowed supporting member being coupled at each end to the motherboard on a first side of the memory card, and being coupled to the mounting block at the first edge; and
   a second bowed supporting member having a first end and a second end, the second bowed supporting member being oriented substantially perpendicular to the first bowed supporting member, the second bowed supporting member being coupled at the first end to the motherboard on a second side of the memory card, and being coupled to the second edge of the mounting block.

5. A bracket for receiving a fan for cooling a memory card comprising:
- a substantially circular receptacle for receiving the fan, the receptacle defined by a mounting block, the mounting block having a first edge and a second edge opposite the first edge;
- a first bowed supporting member having a first end and a second end, the first and second ends for coupling the first bowed supporting member at each end to a motherboard on a first side of a memory card, the first bowed supporting member being coupled to the mounting block at the first edge; and
- a second bowed supporting member having a first end and a second end, the second bowed supporting member being oriented substantially perpendicular to the first bowed supporting member, the first end for coupling the second bowed supporting member to a motherboard on a second side of a memory card, and the second bowed supporting member being coupled to the second edge of the mounting block.

6. The bracket of claim 5 wherein the receptacle has a diameter between about 30 mm and about 50 mm.

7. The bracket of claim 6 wherein the first end and the second end of the first bowed supporting member each terminate with a collar having an outer diameter that is less than about 0.6 inches, each collar defining an orifice that is less than about 0.2 inches, the orifice for receiving a fastener for fastening the bracket to a motherboard.

* * * * *